(12) United States Patent
Zhou et al.

(10) Patent No.: US 11,694,958 B2
(45) Date of Patent: Jul. 4, 2023

(54) LAYOUT DESIGN FOR THRESHOLD VOLTAGE TUNING

(71) Applicant: International Business Machines Corporation, Armonk, NY (US)

(72) Inventors: Huimei Zhou, Albany, NY (US); Su Chen Fan, Cohoes, NY (US); Miaomiao Wang, Albany, NY (US); Zuoguang Liu, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 16/891,600

(22) Filed: Jun. 3, 2020

(65) Prior Publication Data
US 2021/0384139 A1 Dec. 9, 2021

(51) Int. Cl.
*H01L 23/532* (2006.01)
*H01L 21/768* (2006.01)

(52) U.S. Cl.
CPC .. *H01L 23/53266* (2013.01); *H01L 21/76846* (2013.01); *H01L 21/76849* (2013.01); *H01L 23/53238* (2013.01)

(58) Field of Classification Search
CPC ......... H01L 23/53266; H01L 23/53257; H01L 21/76846; H01L 21/76847; H01L 21/76849; H01L 21/7685; H01L 21/76841; H01L 21/76843; H01L 23/53238; H01L 21/76838
See application file for complete search history.

(56) References Cited

U.S. PATENT DOCUMENTS

| | | | |
|---|---|---|---|
| 8,846,476 B2 | 9/2014 | Liu et al. | |
| 9,336,348 B2 | 5/2016 | Hsieh et al. | |
| 9,397,009 B2 | 7/2016 | Chambers et al. | |
| 9,583,486 B1 | 2/2017 | Ando et al. | |
| 9,871,114 B2 | 1/2018 | Wu et al. | |
| 10,276,445 B2 | 4/2019 | Fan et al. | |
| 10,290,546 B2 | 5/2019 | Chiang et al. | |
| 2007/0264824 A1* | 11/2007 | Siew | H01L 21/02074 257/E21.59 |
| 2008/0157380 A1* | 7/2008 | Hong | H01L 21/76849 257/E23.142 |

(Continued)

OTHER PUBLICATIONS

Min-Cheng Chen et al., "A 10 nm Si-based Bulk FinFETs 6T SRAM with Multiple Fin Heights Technology for 25% Better Static Noise Margin," Symposium on VLSI Technology, Jun. 2013, pp. T218-T219.

(Continued)

*Primary Examiner* — Thanh T Nguyen
(74) *Attorney, Agent, or Firm* — James Olsen; Michael J. Chang, LLC

(57) ABSTRACT

Semiconductor device layout designs for Vt tuning are provided. In one aspect, a semiconductor device is provided. The semiconductor device includes: at least one first metal line in contact with a source or drain of an FET; at least one second metal line in contact with a gate of the FET, wherein the first metal line crosses the second metal line; and an oxygen diffusion blocking layer on top of the at least one first metal line in an overlap area of the at least one first metal line and the at least one second metal line. A method of forming a semiconductor device is also provided.

13 Claims, 6 Drawing Sheets

(56) References Cited

U.S. PATENT DOCUMENTS

2009/0045515 A1\* 2/2009 Gonzalez, Jr. .......... H01L 22/14
　　　　　　　　　　　　　　　　　　　　　　438/10
2018/0122908 A1　　5/2018 Balakrishnan et al.
2021/0366765 A1\* 11/2021 Lu ..................... H01L 21/76877

OTHER PUBLICATIONS

Bing Song et al., "Impact of threshold voltage variation on 1S1R crossbar array with threshold switching selectors," Applied Physics A, vol. 123, No. 5, Apr. 2017, 356 (7 pages).

\* cited by examiner

LAYOUT DESIGN FOR THRESHOLD VOLTAGE TUNING

FIELD OF THE INVENTION

The present invention relates to semiconductor device layout designs, and more particularly, to semiconductor device layout designs for threshold voltage (Vt) tuning.

BACKGROUND OF THE INVENTION

With advanced technology nodes, semiconductor device scaling brings about some notable challenges. One such challenge is threshold voltage (Vt) mismatch of devices in a circuit design which can occur based on factors such as implant fluctuations. The effects of implant fluctuations are increased due to scaling. To compensate for these effects, attempts have been made to tune the Vt using techniques such as dipole layers, silicon germanium (SiGe) substrates, etc. However, implementation of these techniques leads to increased fabrication complexity and overall production costs.

Thus, semiconductor designs with threshold voltage control without the need for complex Vt tuning mechanisms would be desirable.

SUMMARY OF THE INVENTION

The present invention provides semiconductor device layout designs for threshold voltage (Vt) tuning. In one aspect of the invention, a semiconductor device is provided. The semiconductor device includes: at least one first metal line in contact with a source or drain of a field-effect transistor (FET); at least one second metal line in contact with a gate of the FET, wherein the first metal line crosses the second metal line; and an oxygen diffusion blocking layer on top of the at least one first metal line in an overlap area of the at least one first metal line and the at least one second metal line.

In another aspect of the invention, another semiconductor device is provided. The semiconductor device includes: at least one first FET and at least one second FET; at least one first metal line in contact with a source or drain of the at least one first FET; at least one second metal line in contact with a gate of the at least one first FET, wherein the first metal line crosses the second metal line; an oxygen diffusion blocking layer on top of the at least one first metal line in an overlap area of the at least one first metal line and the at least one second metal line; a first V0 present over the at least one first metal line and the oxygen diffusion blocking layer in the overlap area; at least one third metal line in contact with a source or drain of the at least one second FET; at least one fourth metal line in contact with a gate of the at least one second FET, wherein the third metal line crosses the fourth metal line; and a second V0 present over the at least one third metal line away from an overlap area of the at least one third metal line and the at least one fourth metal line.

In yet another aspect of the invention, a method of forming a semiconductor device is provided. The method includes: depositing a first dielectric onto a substrate; forming at least one first metal line in the first dielectric, wherein the at least one first metal line is in contact with a source or drain of an FET; forming an oxygen diffusion blocking layer on top of the at least one first metal line; forming at least one second metal line in the first dielectric that crosses the at least one first metal line, wherein the at least one second metal line is in contact with a gate of the FET, wherein the oxygen diffusion blocking layer is present on top of the at least one first metal line in an overlap area of the at least one first metal line and the at least one second metal line.

A more complete understanding of the present invention, as well as further features and advantages of the present invention, will be obtained by reference to the following detailed description and drawings.

DETAILED DESCRIPTION OF PREFERRED EMBODIMENTS

Figure 1:
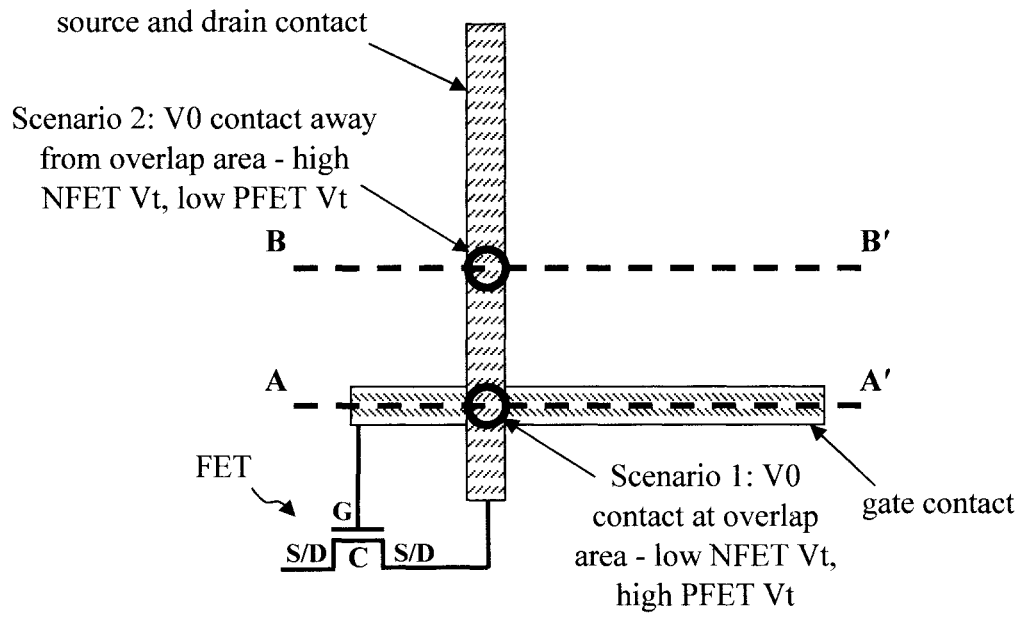
FIG. 1 is a top-down diagram of a gate contact and a source and drain contact layout formed in accordance with the present techniques according to an embodiment of the present invention.

As provided above, scaling increases threshold voltage (Vt) mismatch of devices in a circuit design based on factors such as implant fluctuation. Techniques such as the use of dipole layers, silicon germanium (SiGe) substrates, etc. have been used to tune the Vt of the devices in order to compensate for the mismatch. However, these techniques vastly lead to an increase in fabrication complexity and costs.

As will be described in detail below, circuit designs can include a plurality of field-effect transistors (FETs). Take for instance the case of a static random access memory (SRAM) cell circuit that includes four (4T SRAM), six (6T SRAM), eight (8T SRAM), ten (10T SRAM), etc. transistors per bit. Each transistor includes a source interconnected to a drain by a channel, and a gate for regulating current flow through the channel. During semiconductor device fabrication, metallization processes are employed to form the various metal interconnects of the design coupled to the transistors.

For instance, some of these interconnects are metal lines that contact the gates (also referred to herein as 'gate contacts') and which deliver power to the gates. Others are metal lines that contact the source and drains (also referred to herein as 'source and drain contacts').

These interconnects can be formed using a so called damascene or dual damascene process, whereby lithography and etching techniques are first employed to pattern features (e.g., vias and/or trenches) in a dielectric which are then filled with a metal(s) to form the interconnects (e.g., conductive vias and/or metal lines). With a dual damascene process, when the vias are patterned before the trenches it is also referred to herein as a 'via-first process.' Conversely, when the trenches are patterned before the vias, it is referred to herein as a 'trench-first process.'

The metal lines that form the gate contacts and the metal lines that form the source and drain contacts can be arranged overlapping one another, forming a contact cross bar design. For instance, the metal lines that form the gate contacts might be oriented orthogonal to the metal lines that form the source and drain contacts. In a conventional fabrication flow, the trenches for the gate contacts and source and drain contacts are typically patterned concurrently, i.e., at the same time. Likewise, the metal(s) is typically filled into the gate contact trenches and source and drain contact trenches concurrently to form the gate contact and source and drain contact, respectively. Notably, it has been found herein that the overlap area between the metal lines that form the gate contacts and the metal lines that form the source and drain contacts can lead to a Vt shift. Without being bound by any particular theory, it is thought that the subsequent etch processes used to form V0 contacts introduces oxygen which diffuses to the gate stack causing n-channel FET (NFET) Vt increase and p-channel FET (PFET) Vt decrease. By contrast, with the present cross bar design having metal lines bounded by an oxygen block layer, oxygen vacancy (e.g., in the gate dielectric) will exist resulting in an NFET Vt decrease and a PFET Vt increase. The effects of threshold voltage shift by oxygen vacancy or oxygen rich scenarios are even more significant in devices with scaled dimensions. The term 'V0 contacts' as used herein refers to conductive vias which serve as vertical interconnects to the source and drain contacts. See below.

Advantageously, it has also been found herein that rather than forming the gate contacts and source and drain contacts at the same time, the source and drain contacts can instead be formed separately from the gate contacts, i.e., they are formed at different times. Doing so enables the formation of an oxygen diffusion blocking layer over the source and drain contact which, during subsequent V0 contact processing, will prevent oxygen diffusion into the gate contacts. Further, according to an exemplary embodiment, this oxygen diffusion blocking layer is present only at the intersection of the gate contacts and the source and drain contacts (i.e., overlap area). Thus, placement of the V0 contact, i.e., either on top of the overlap area or away from the overlap area can be used to tune the Vt of the device design without any complex and costly fabrication requirements.

To illustrate the present techniques, an exemplary methodology for forming a semiconductor device is now described by way of reference to FIGS. 1-13. For instance, FIG. 1 provides a top-down view of a gate contact and a source and drain contact layout that will be formed in accordance with the present techniques. As shown in FIG. 1, a contact cross bar design is employed whereby at least one gate contact crosses at least one source and drain contact. For instance, in this particular example, the gate contact is oriented orthogonal to the source and drain contact. Based on this configuration, there is an overlap area at the intersection of the source contact and the drain contact. As provided above, an oxygen diffusion blocking layer will be formed over the source and drain contact in this overlap area.

As its name implies the source and drain contact (e.g., a metal line) is in contact with a source or drain of an FET. As shown in FIG. 1, each transistor includes a source (S) interconnected to a drain (D) by a channel (C). A gate (G) regulates current flow through the channel (C). In the same manner, the gate contact (e.g., a metal line that crosses the source and drain contact) is in contact with a gate of the FET. Where the V0 contact is located, i.e., either in the overlap area at the intersection of the gate contact and the source and drain contact, or away from the overlap area, will be used to control the Vt.

Namely, in one exemplary scenario ("Scenario 1"), the V0 contact will be formed in the overlap area over the source and drain contact. In that case, the oxygen diffusion blocking layer will prevent oxygen from the V0 contact formation from diffusing through to the gate contact and shifting the Vt. By contrast, in another exemplary scenario ("Scenario 2"), the V0 contact will be formed along the source and drain contact away from the overlap area. The oxygen diffusion blocking layer is present over the source and drain contact only in the overlap area. Thus, away from the overlap area, oxygen from the V0 contact formation can diffuse through to the gate contact and shift the Vt. Thus, given the presence of the oxygen diffusion blocking layer in the overlap area, placement of the V0 contact can be varied to tune the Vt.

Namely, as provided above, oxygen diffusion during V0 formation and subsequent processes can shift the Vt in the negative direction for p-channel FETs (PFETs) and in the positive direction for n-channel FETs (NFETs). Thus, as shown in FIG. 1, with Scenario 1 (V0 present in the overlap area over the source and drain contact and the oxygen diffusion blocking layer) the result is a low NFET Vt and a high PFET Vt. Conversely, with Scenario 2 (V0 present outside of the overlap area) the result is a high NFET Vt and a low PFET Vt.

Dashed lines are provided in FIG. 1 to illustrate the orientation of the cross-sectional views shown in the following figures. For instance, cross-sectional views A-A' will depict cuts through/parallel to the gate contact, and perpendicular to the source and drain contact in the overlap area. Cross-sectional views B-B' will depict cuts perpendicular to the source and drain contact away from the overlap area. In the present example, the source and drain contact will be formed first, followed by the gate contact, and then the V0 contact. Thus, the cross-sectional views A-A' and B-B' for the first few steps of the process which depict formation of the source and drain contact will appear the same. These views will be labeled "A-A'/B-B'" accordingly. See, e.g., FIGS. 2-4. However, when the cross-sectional views A-A' and B-B' differ, a separate FIG. XA and FIG. XB labeled A-A' and B-B', respectively will be provided.

Figure 2:
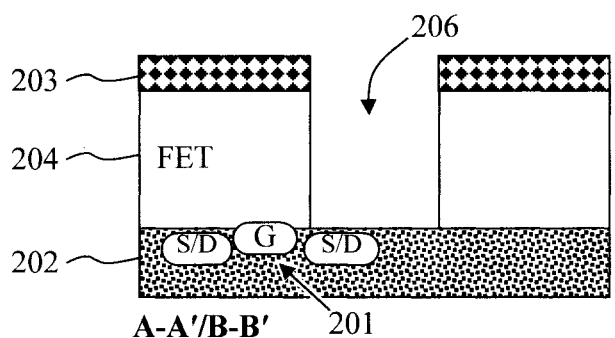
FIG. 2 is a cross-sectional diagram illustrating a (first) dielectric having been deposited on a substrate, and at least one (first) trench having been patterned in the first dielectric according to an embodiment of the present invention.
Figure 3:
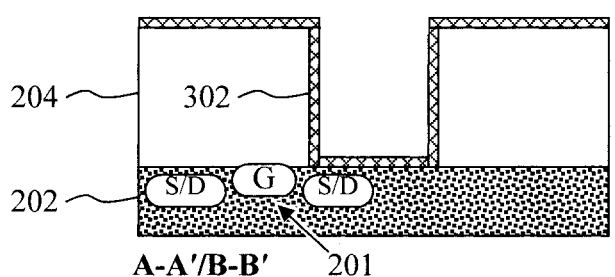
FIG. 3 is a cross-sectional diagram illustrating a conformal liner having been deposited onto the first dielectric and lining the first trench according to an embodiment of the present invention.

Referring to FIG. 2 (a cross-sectional view A-A'/B-B') the process begins with the deposition of a dielectric 204 on a substrate 202, and the patterning of at least one trench 206 in the dielectric 204. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Substrate 202 may already have pre-built structures (not shown) such as transistors, diodes, capacitors, resistors, isolation regions (e.g., shallow trench isolation (STI) regions), interconnects, wiring, etc. For instance, according to an exemplary embodiment, the substrate 202 includes at least one transistor 201. Transistor 201 is generally representative of any type of NFET and/or PFET device that may be employed in accordance with the present techniques, such as, but not limited to, planar FET devices and/or non-planar FET devices such as finFET devices, nanowire/nanosheet FET devices, vertical FET (VFET) devices, etc. Further, the illustration of a single FET in the following figures is done merely for ease and clarity of depiction. Namely, embodiments are contemplated herein where multiple transistors are employed. See, for example, the SRAM cell described in detail below.

Suitable materials for the dielectric 204 include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

A process such as chemical vapor deposition (CVD), atomic layer deposition (ALD) or physical vapor deposition (PVD) can be employed to deposit the dielectric 204 on substrate 202. Following deposition, dielectric 204 can be planarized using a process such as chemical mechanical polishing (CMP).

According to an exemplary embodiment, lithography and etching techniques are employed to pattern the trench 206 in dielectric 204. With lithography and etching processes, a lithographic stack (not shown), e.g., photoresist/organic planarizing layer (OPL)/anti-reflective coating (ARC), is used to pattern a hardmask 203 with the footprint and location of trench 206. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, hardmask 203 can be formed by other suitable techniques, including but not limited to, sidewall image transfer (SIT), self-aligned double patterning (SADP), self-aligned quadruple patterning (SAQP), and other self-aligned multiple patterning (SAMP).

An etch is then used to transfer the pattern from hardmask 203 to the underlying dielectric 204, forming trench 206 in dielectric 204. By way of example only, a directional (anisotropic) etching process such as reactive ion etching (RIE) can be employed for the trench 206 etch. Hardmask 203 can be removed following the trench etch. As will become apparent from the description that follows, in the present example, trench 206 corresponds to the source and drain contact. By contrast with conventional process flows, the source and drain contact and the gate contact will be formed at different times. In other words, with conventional process flows the patterning of trenches for the source and drain contact and for the gate contact would be performed concurrently. However, as highlighted above, forming the source and drain contact and gate contact at different times advantageously enables the placement of the oxygen diffusion blocking layer on top of the source and drain contact. See below.

A conformal liner 302 is then deposited onto the dielectric 204 and lining the trench 206. See FIG. 3 (a cross-sectional view A-A'/B-B'). Suitable materials for liner 302 include, but are not limited to, titanium (Ti), tantalum (Ta), titanium nitride (TiN), tantalum nitride (TaN) and/or ruthenium (Ru). A process such as CVD, ALD or PVD can be employed to deposit liner 302. According to an exemplary embodiment, liner 302 has a thickness of from about 2 nanometers (nm) to about 5 nm and ranges therebetween. Liner 302 acts as a barrier layer preventing diffusion of the contact metal(s) (see below) into the surrounding dielectric. Further, although not shown in the figures, a seed layer can also be deposited into and lining trench 206 prior to contact metal deposition. A seed layer facilitates plating of the contact metal into the trench 206.

Figure 4:
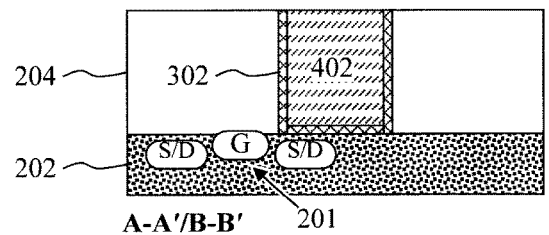
FIG. 4 is a cross-sectional diagram illustrating a contact metal(s) having been deposited into and filling the first trench to form a first metal line according to an embodiment of the present invention.
Figure 5:
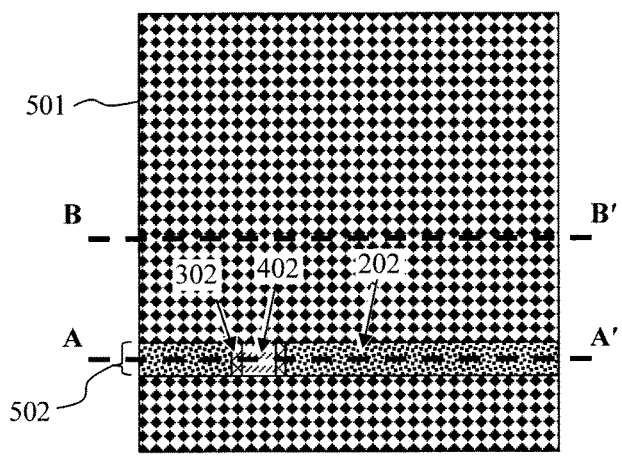
FIG. 5 is a top-down diagram illustrating at least one (second) trench having been patterned in the first dielectric oriented orthogonal to the first metal line according to an embodiment of the present invention.

A contact metal or combination of contact metals is then deposited into and filling the trench 206 to form metal line 402. See FIG. 4. Following deposition, the metal overburden can be removed using a process such as CMP. As shown in FIG. 4, this CMP step may remove the liner 302 from the top surface of dielectric 204. As highlighted above, in this example the metal line 402 will serve as a source and drain contacts. Namely, as shown in FIG. 4, metal line 402 is in contact with the source (S) of transistor 201.

Suitable contact metals include, but are not limited to, copper (Cu), ruthenium (Ru), cobalt (Co) and/or tungsten (W). A process such as evaporation, sputtering or electrochemical plating can be employed to deposit the contact metal into trench 206.

The above-described process is then repeated to pattern at least one trench 502 in dielectric 204. See FIG. 5 (a top-down view). Trench 502 may also be referred to herein as a 'second trench' whereby trench 206 I a 'first trench.' Namely, a patterned hardmask 501 is formed marking the footprint and location of the trench 502. As provided above, suitable hardmask materials include, but are not limited to, SiN, SiON, SiCN, and/or SiOx. Hardmask 501 can be patterned using direct lithography and etching or other technique such as SIT, SADP, SAQP, or SAMP. An etch (such as RIE) is then used to transfer the pattern from hardmask 501 to the underlying dielectric 204, forming trench 502 in dielectric 204. See also FIG. 6A (a cross-sectional view A-A').

Figure 6A:
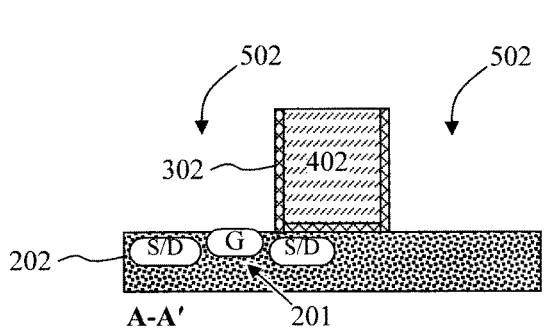
FIG. 6A is a cross-sectional diagram illustrating the second trench having been patterned in the first dielectric oriented orthogonal to the first metal line from a view perpendicular to the source and drain contact in the overlap area.
Figure 6B:
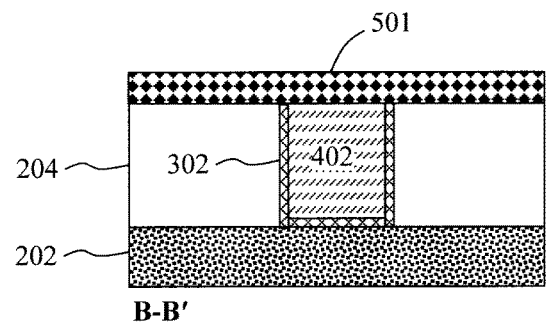
FIG. 6B is a cross-sectional diagram illustrating the second trench having been patterned in the first dielectric oriented orthogonal to the first metal line from a view perpendicular to the source and drain contact away from the overlap area according to an embodiment of the present invention.

Trench 502 corresponds to the gate contact and, as such, is oriented orthogonal to metal line 402. For instance, in the depiction shown in FIG. 6A, trench 502 extends left and right across the page, whereas metal line 402 extends into and out of the page. Referring to FIG. 6B (a cross-sectional view B-B'), a cut perpendicular to the metal line 402 outside of trench 502 reveals that, away from the overlap area, the metal line 402 is buried in dielectric 204. In this region, hardmask 501 covers both the metal line 402 and dielectric 204 during the patterning of trench 502.

As above, prior to metal fill, a conformal oxygen diffusion blocking layer 702 is next deposited into and lining trench 502, and over the metal line 402. See FIG. 7A (a cross-sectional view A-A'). Suitable materials for oxygen diffusion blocking layer 702 include, but are not limited to, Ti, Ta, TiN, TaN and/or Ru. Oxygen diffusion blocking layer 702 can be the same material, or a different material from liner 302. A process such as CVD, ALD or PVD can be employed to deposit oxygen diffusion blocking layer 702. According to an exemplary embodiment, oxygen diffusion blocking layer 702 has a thickness of from about 2 nm to about 5 nm and ranges therebetween. Although not shown in the figures, a seed layer can also be deposited into and lining trench 502 prior to contact metal deposition. A seed layer facilitates plating of the contact metal into the trench 502.

Figure 7A:
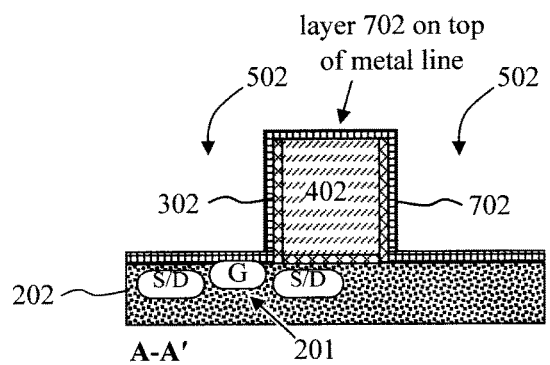
FIG. 7A is a cross-sectional diagram illustrating a conformal oxygen diffusion blocking layer having been deposited into and lining the first trench, and over the first metal line from a view perpendicular to the source and drain contact in the overlap area.

As shown in FIG. 7A, liner 302 is already present under and along the sidewalls of metal line 402. Thus, deposition of oxygen diffusion blocking layer 702 (over liner 302) increases the thickness of the liner along the sidewalls of metal line 402. Like liner 302, oxygen diffusion blocking layer 702 acts as a barrier layer preventing diffusion of the contact metal(s) (see below) into the surrounding dielectric. Notably, however, oxygen diffusion blocking layer 702 is now present along the top of metal line 402 (as well as along the sidewalls of metal line 402). Oxygen diffusion blocking layer 702 over the top of metal line 402 and liner 302/oxygen diffusion blocking layer 702 along the sidewalls of metal line 402 serves as an oxygen diffusion blocking layer over metal line 402. This oxygen diffusion blocking layer will, during subsequent V0 contact processing, prevent oxygen diffusion into the gate contacts thereby preventing threshold voltage shifts.

Figure 7B:
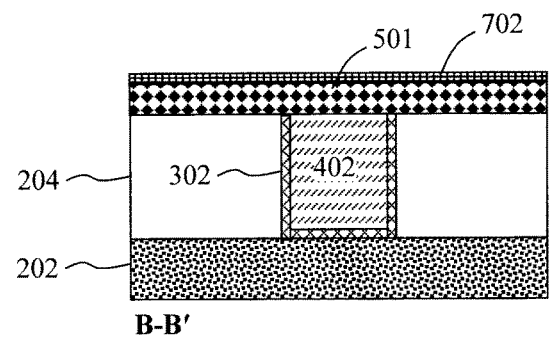
FIG. 7B is a cross-sectional diagram illustrating how the oxygen diffusion blocking layer will remain only in the overlap area from a view perpendicular to the source and drain contact away from the overlap area according to an embodiment of the present invention.

According to an exemplary embodiment, this oxygen diffusion blocking layer is present only at the intersection of the gate contact and the source and drain contact (i.e., in the overlap area). Namely, as shown in FIG. 7B (a cross-sectional view B-B'), outside of the overlap area metal line 402 is covered by hardmask 501. Thus, the oxygen diffusion blocking layer 702 deposited in this region will be removed along with the hardmask 501, and the contact metal overburden.

Figure 8A:
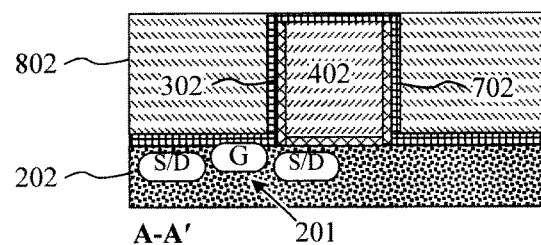
FIG. 8A is a cross-sectional diagram illustrating a contact metal(s) having been deposited into and filling the second trench to form a second metal line from a view perpendicular to the source and drain contact in the overlap area.

Namely, a contact metal or combination of contact metals is then deposited into and filling the trench 502 to form metal line 802. See FIG. 8A (a cross-sectional view A-A'). As highlighted above, in this example the metal line 802 will serve as a gate contact. Namely, as shown in FIG. 8A, metal line 802 is in contact with the gate (G) of transistor 201. Following deposition, the metal overburden can be removed using a process such as CMP, stopping on oxygen diffusion blocking layer 702. Namely, as shown in FIG. 8A, care must be taken not to remove oxygen diffusion blocking layer 702 from the top of metal line 402. Namely, oxygen diffusion blocking layer 702 at the top of metal line 802 will serve as the oxygen diffusion blocking layer at the intersection of the gate contact and the source and drain contact (i.e., in the overlap area). As provided above, suitable contact metals include, but are not limited to, Cu, Ru, Co and/or W. A process such as evaporation, sputtering or electrochemical plating can be employed to deposit the contact metal into trench 502.

Figure 8B:
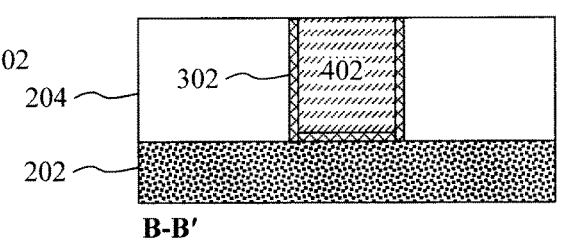
FIG. 8B is a cross-sectional diagram the oxygen diffusion blocking layer having been removed away from the overlap area from a view perpendicular to the source and drain contact away from the overlap area according to an embodiment of the present invention.

According to an exemplary embodiment, this oxygen diffusion blocking layer is present only at the intersection of the gate contacts and the source and drain contacts (i.e., in the overlap area). As shown in FIG. 8B (a cross-sectional view B-B'), outside of the overlap area CMP of the contact metal overburden (see above) removes what remains of hardmask 501, and with it the oxygen diffusion blocking layer 702 deposited in this region.

Figure 9A:
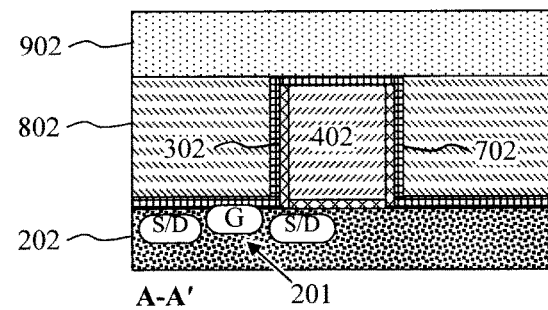
FIG. 9A is a cross-sectional diagram illustrating a second dielectric having been deposited onto the first dielectric over the first metal line and the second metal line from a view perpendicular to the source and drain contact in the overlap area.
Figure 9B:
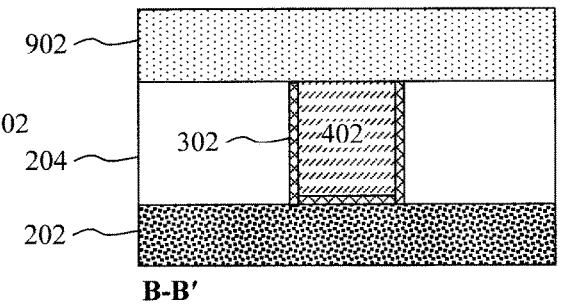
FIG. 9B is a cross-sectional diagram illustrating the second dielectric having been deposited onto the first dielectric over the first metal line from a view perpendicular to the source and drain contact away from the overlap area according to an embodiment of the present invention.

A dielectric 902 is then deposited onto dielectric 204 over metal line 402 and metal line 802. See FIG. 9A (a cross-sectional view A-A'). The terms 'first' and 'second' may also be used herein when referring to dielectric 204 and dielectric 902, respectively. Suitable materials for the dielectric 902 include, but are not limited to, oxide low-κ materials such as SiOx and/or oxide ULK-ILD materials such as pSiCOH. A process such as CVD, ALD or PVD can be employed to deposit the dielectric 902. Following deposition, dielectric 902 can be planarized using a process such as CMP. As shown in FIG. 9A, in the overlap area, dielectric 902 is separated from metal line 402 by oxygen diffusion blocking layer 702. By contrast, as shown in FIG. 9B (a cross-sectional view B-B'), outside of the overlap area, there is nothing separating dielectric 902 from the top of metal line 402, i.e., dielectric 902 is disposed directly on the top of metal line 402.

In one exemplary embodiment (Scenario 1), a V0 contact is next formed on top of the overlap area. See FIGS. 10A, 10B and 11. In that case, oxygen diffusion blocking layer 702 at the top of metal line 402 and liner 302/oxygen diffusion blocking layer 702 along the sidewalls of metal line 402 (only in the overlap area) will serve as an oxygen diffusion blocking layer that prevents oxygen from the V0 contact formation from diffusing through to the gate contact and shifting the Vt. In an alternative embodiment, the V0 contact is instead formed away from the overlap area (see FIGS. 12-13, described below).

Figure 10A:
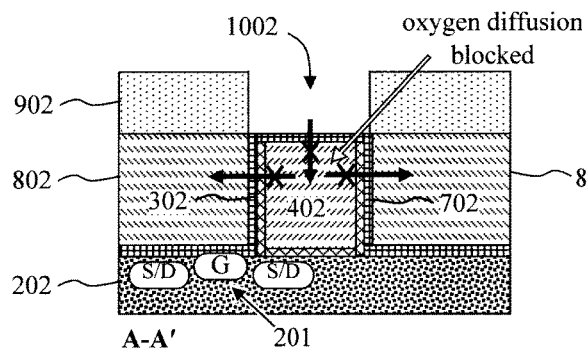
FIG. 10A is a cross-sectional diagram illustrating a via having been patterned in the second dielectric over the first metal line and the oxygen diffusion blocking layer in the overlap area from a view perpendicular to the source and drain contact in the overlap area.

According to Scenario 1, a via 1002 is next patterned in dielectric 902 over the metal line 402 and oxygen diffusion blocking layer 702 in the overlap area. See FIG. 10A (a cross-sectional view A-A'). Lithography and etching techniques (see above) can be employed for the via etch. As shown in FIG. 10A, via 1002 extends completely through dielectric 902, stopping on oxygen diffusion blocking layer 702 at the top of metal line 402. In other words, oxygen diffusion blocking layer 702 remains present over the top of metal line 402 at the bottom of via 1002.

Advantageously, oxygen diffusion blocking layer 702 disposed on the top of metal line 402 and liner 302/oxygen diffusion blocking layer 702 disposed along the sidewalls of metal line 402 act as an oxygen diffusion blocking layer that prevents oxygen introduced by the via 1002 etch from diffusing through metal lines 402/802. See FIG. 10A. As described above, it is thought that such oxygen diffusion can shift the threshold voltage in the negative direction.

Figure 10B:
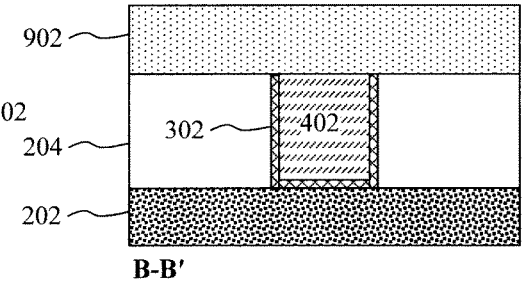
FIG. 10B is a cross-sectional diagram illustrating that the second dielectric remains intact over the first metal line outside of the overlap area from a view perpendicular to the source and drain contact away from the overlap area according to an embodiment of the present invention.
Figure 11:
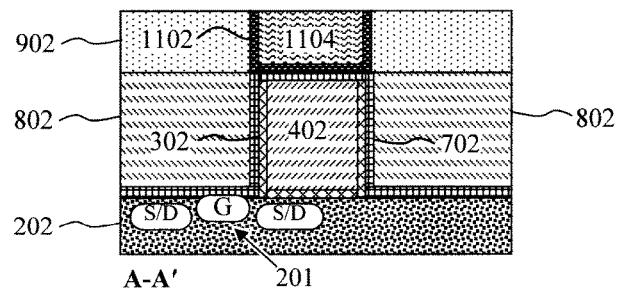
FIG. 11 is a cross-sectional diagram illustrating a conformal liner having been deposited onto the second dielectric and lining the via, and a contact metal(s) having been deposited into and filling the via to form a V0 contact from a view perpendicular to the source and drain contact in the overlap area according to an embodiment of the present invention.

With Scenario 1, the via 1002 is placed over the metal line 402 in the overlap area. Thus, as shown in FIG. 10B (a cross-sectional view B-B'), the dielectric 902 remains intact over metal line 402 outside of the overlap area.

A conformal liner 1102 is then deposited onto the dielectric 902 and lining the via 1002. See FIG. 11 (a cross-sectional view A-A'). It is notable that a cross-sectional view B-B' (outside of the overlap area remains the same as that shown in FIG. 10B. Suitable materials for liner 1102 include, but are not limited to, Ti, Ta, TiN, TaN and/or Ru. A process such as CVD, ALD or PVD can be employed to deposit liner 1102. According to an exemplary embodiment, liner 1102 has a thickness of from about 2 nm to about 5 nm and ranges therebetween. Liner 1102 acts as a barrier layer preventing diffusion of contact metal(s) (see below) into the surrounding dielectric. Further, although not shown in the figures, a seed layer can also be deposited into and lining via 1002 prior to contact metal deposition. A seed layer facilitates plating of the contact metal into the via 1002.

A contact metal or combination of metals is then deposited into and filling the via 1002 to form V0 contact 1104. Following deposition, the metal overburden can be removed using a process such as CMP. As provided above, suitable contact metals include, but are not limited to, Cu, Ru, Co and/or W. A process such as evaporation, sputtering or electrochemical plating can be employed to deposit the contact metal into via 1002.

In an alternate exemplary embodiment (Scenario 2), the V0 contact is formed along the metal line 402 away from the overlap area. See FIGS. 12A, 12B and 13. As provided above, there is no oxygen diffusion blocking layer on top of the metal line 402 outside of the overlap area. Thus, away from the overlap area, oxygen from the V0 contact formation can diffuse through metal line 402 to metal line 802 and shift the Vt. As such, given the presence of the oxygen diffusion blocking layer selectively in the overlap area, placement of the V0 contact can be varied (i.e., according to either Scenario 1 or Scenario 2) in order to tune the Vt without any complex and costly fabrication requirements.

Figure 12A:
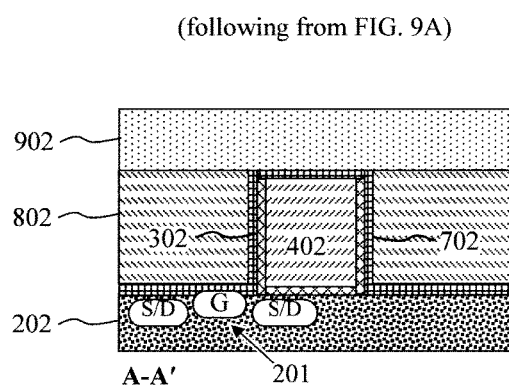
FIG. 12A is a cross-sectional diagram, which follows from FIG. 9A, illustrating according to an alternative embodiment how the second dielectric can remain intact over the first metal line in the overlap area from a view perpendicular to the source and drain contact in the overlap area.

With Scenario 2, the V0 contact will be placed over the metal line 402 away the overlap area. Thus, as shown in FIG. 12A (a cross-sectional view A-A') which follows from FIG. 9A, the dielectric 902 remains intact over metal line 402 in the overlap area.

Figure 12B:
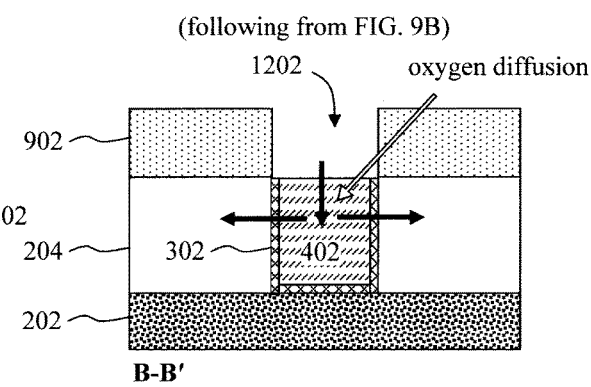
FIG. 12B is a cross-sectional diagram illustrating a via having been patterned in the second dielectric over the first metal line away from the overlap area from a view perpendicular to the source and drain contact away from the overlap area according to an embodiment of the present invention.
Figure 13:
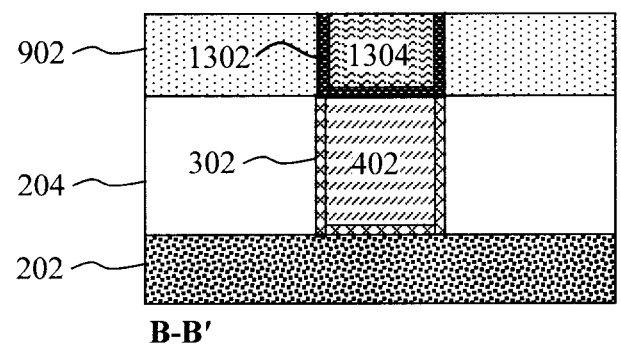
FIG. 13 is a cross-sectional diagram illustrating a conformal liner having been deposited onto the second dielectric and lining the via, and a contact metal(s) having been deposited into and filling the via to form a V0 contact from a view perpendicular to the source and drain contact away from the overlap area according to an embodiment of the present invention.

As shown in FIG. 12B (a cross-sectional view B-B') which follows from FIG. 9B, a via 1202 is next patterned in dielectric 902 over the metal line 402 away from the overlap area. Lithography and etching techniques (see above) can be employed for the via etch. As shown in FIG. 12B, via 1202 extends completely through dielectric 902, stopping on metal line 402. It is noted that oxygen diffusion blocking layer 702 is absent from the top of metal line 402 in this region away from the overlap area. Thus, as shown in FIG. 12B, metal line 402 is exposed at the bottom of via 1202.

Without an oxygen diffusion blocking layer at the top of metal line 402, oxygen introduced by the via 1202 etch can diffuse through metal lines 402/802. See FIG. 12B. While there is a liner 302 along the sidewalls of metal line 402, the oxygen diffusion blocking layer 702 along the top and sidewalls of metal line 402 is absent (compare FIG. 12A and FIG. 12B). Thus, there is significantly less of a barrier to oxygen diffusion outside of the overlap area. As described above, it is thought that such oxygen diffusion can shift the threshold voltage in the negative direction. Thus, by simply locating the V0 contact either in the overlap area (as per Scenario 1) or outside/away from the overlap area (Scenario 2), one can easily achieve threshold voltage tuning.

A conformal liner 1302 is then deposited onto the dielectric 902 and lining the via 1202. See FIG. 13 (a cross-sectional view B-B'). It is notable that a cross-sectional view A-A' (within the overlap area remains the same as that shown in FIG. 12A. As provided above, suitable materials for liner 1302 include, but are not limited to, Ti, Ta, TiN, TaN and/or Ru. A process such as CVD, ALD or PVD can be employed to deposit liner 1302. According to an exemplary embodiment, liner 1302 has a thickness of from about 2 nm to about 5 nm and ranges therebetween. Liner 1302 acts as a barrier layer preventing diffusion of contact metal (s) (see below) into the surrounding dielectric. Further, although not shown in the figures, a seed layer can also be deposited into and lining via 1302 prior to contact metal deposition. A seed layer facilitates plating of the contact metal into the via 1302.

A contact metal or combination of metals is then deposited into and filling the via 1202 to form V0 contact 1304. Following deposition, the metal overburden can be removed using a process such as CMP. As provided above, suitable contact metals include, but are not limited to, Cu, Ru, Co and/or W. A process such as evaporation, sputtering or electrochemical plating can be employed to deposit the contact metal into via 1202.

The present techniques are further illustrated by way of reference to the following, non-limiting example. In this example, the selective placement of the V0 contact (using the methods detailed above) is employed to easily tune the threshold voltage in an exemplary SRAM layout to achieve a relatively higher threshold voltage at the pass gate (PG) transistors and relatively lower threshold voltage at the pull down (PD) transistors for a larger noise margin without additional patterning steps.

Figure 14:
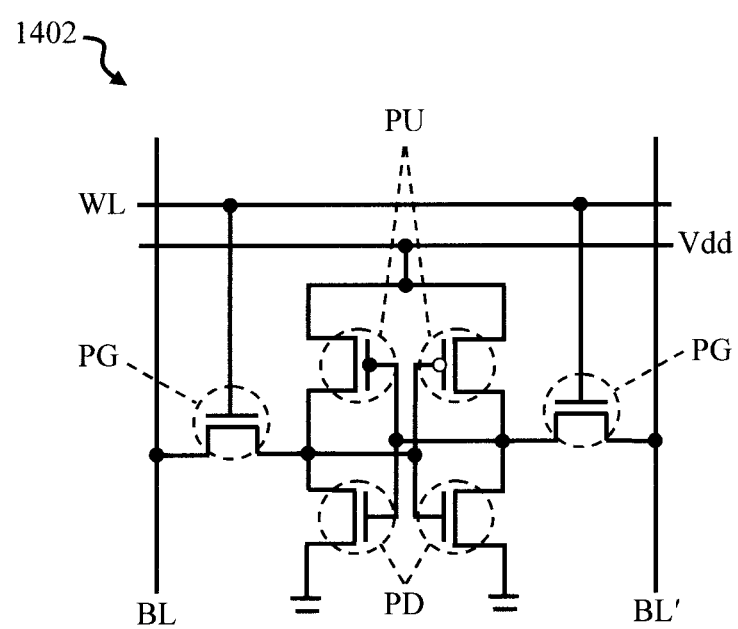
FIG. 14 is a cross-sectional diagram illustrating an exemplary 6T static random access memory (SRAM) device according to an embodiment of the present invention.

The present example involves a 6T SRAM device design. It is notable, however, that the present techniques are generally applicable to any semiconductor field-effect transistor (FET) design. An exemplary 6T SRAM device 1402 is shown in FIG. 14. As shown in FIG. 14, SRAM device 1402 includes six FET transistors, i.e., two pull down (PD) transistors, two pass gate (PG) transistors, and two pull up (PU) transistors. For clarity, the terms 'first,' 'third,' etc. may also be used herein when referring to the PD, PG, PU transistors. According to an exemplary embodiment, the PD transistors and PG transistors are NFETs and the PU transistors are PFETs. A word line (WL) is connected to the gate of each of the PG transistors. Bit lines (BL, BL') are connected to the source (S) of each of the PG transistors. A power supply line Vdd is connected to the drains of each of the PU transistors.

Figure 15:
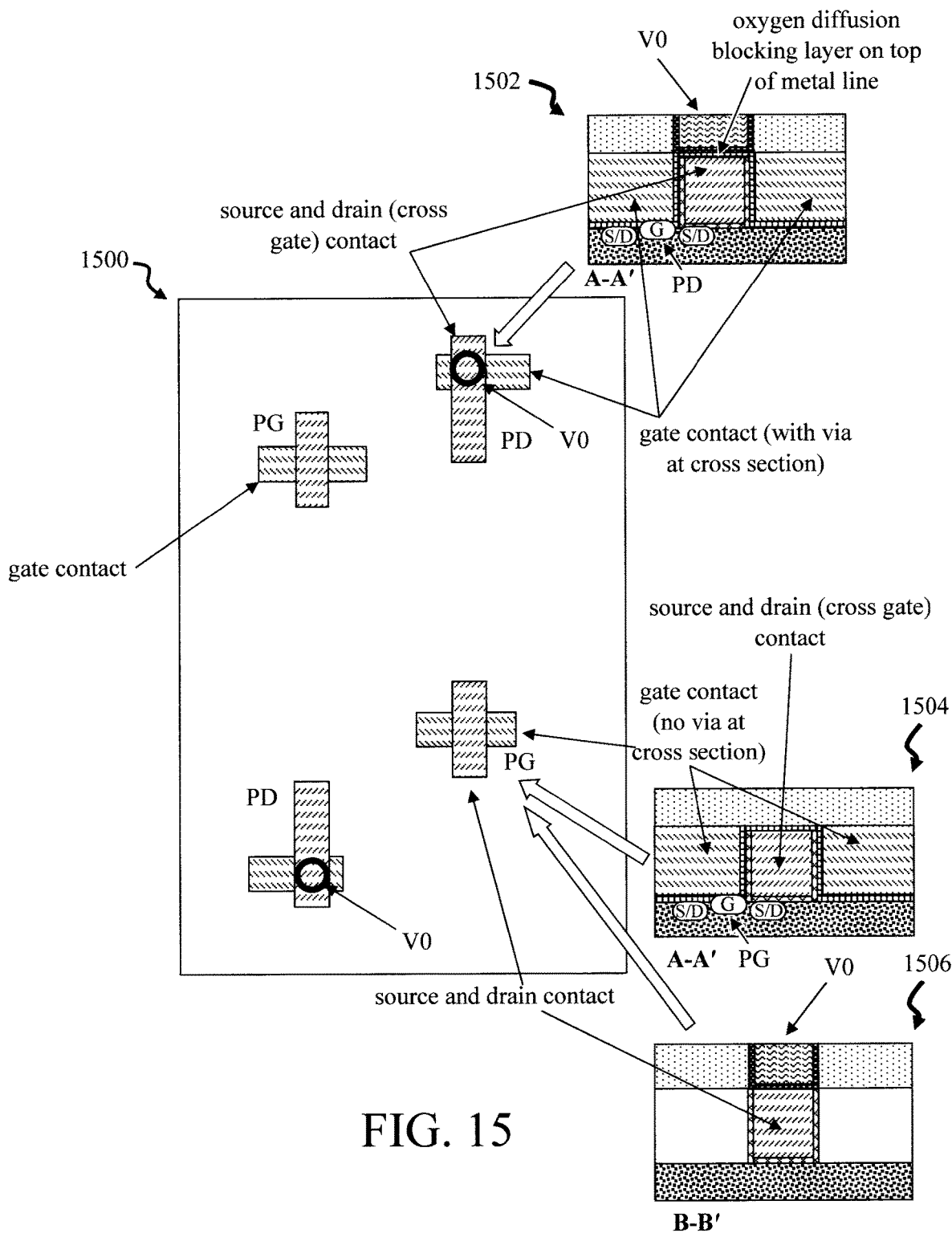
FIG. 15 is a cross-sectional diagram illustrating an exemplary layout of the interconnects, i.e., source and drain contacts and gate contacts, of the SRAM device of FIG. 14 according to an embodiment of the present invention.

In the instant example, the above-described cross-bar gate contact and source and drain contact design is employed whereby the V0 contact is placed in the overlap area of the PD transistors to make the PD transistors higher current/lower threshold voltage than the PG transistors. Namely, referring to FIG. 15, an exemplary layout 1500 of the interconnects, i.e., source and drain contacts and gate contacts, of SRAM device 1402 is provided. FIG. 15 provides a top-down view of the layout 1500, as well as select cross-sectional views (see below).

As shown in FIG. 15, the interconnects to the PD and PG transistors have a cross-bar design whereby the gate contact crosses the source and drain contact. For clarity, terms 'first'/'second' and 'third'/'fourth' may also be used herein when referring to the source and drain contact and gate contact of the PD and PG transistors, respectively. As shown in the cross-sectional view A-A' 1502, an oxygen diffusion blocking layer is present on top of the source and drain contact of the PD transistors in an overlap area of the source and drain contact and the gate contact, and a V0 contact is present over the source and drain contact and the oxygen diffusion blocking layer in the overlap area. The process for forming an interconnect structure configured in this manner with a V0 contact present in the overlap area over an oxygen diffusion blocking layer was described in detail above.

By comparison, as shown in the cross-sectional view A-A' 1504 and B-B' 1506, no oxygen diffusion blocking layer is present on top of the source and drain contact of the PG transistors. As described above, without the present oxygen diffusion blocking layer, oxygen from the V0 contact formation can diffuse through to the gate contact and shift (i.e., increase) the Vt of the (NFET) PG transistors relative to the (NFET) PD transistors that have oxygen diffusion blocked. As a result, the PD transistors in layout 1500 will have a higher current/lower Vt than the PG transistors. The purpose is to make the PD transistors stronger than the PG transistors so that the SRAM noise margin is improved. The process for forming an interconnect structure configured in this manner with a V0 contact present away from the overlap area was described in detail above. For clarity, the terms 'first,' etc. may also be used herein when referring to the V0 contacts of the PD transistors, PG transistors, etc.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:
   at least one first metal line in contact with a source or drain of a field-effect transistor (FET);
   at least one second metal line in contact with a gate of the FET, wherein the first metal line crosses the second metal line; and
   an oxygen diffusion blocking layer on top of the at least one first metal line in only an overlap area of the at least one first metal line and the at least one second metal line.

2. The semiconductor device of claim 1, further comprising:
   a vertical interconnect (V0) present over the at least one first metal line.

3. The semiconductor device of claim 2, wherein the V0 is present over the at least one first metal line and the oxygen diffusion blocking layer in the overlap area.

4. The semiconductor device of claim 2, wherein the V0 is present over the at least one first metal line away from the overlap area.

5. The semiconductor device of claim 1, wherein the at least one first metal line is oriented orthogonal to the at least one second metal line.

6. The semiconductor device of claim 1, wherein the oxygen diffusion blocking layer is absent from the top of the at least one first metal line away from the overlap area.

7. The semiconductor device of claim 1, wherein the oxygen diffusion blocking layer comprises a material selected from the group consisting of: titanium (Ti), tantalum (Ta), titanium nitride (TiN), tantalum nitride (TaN), ruthenium (Ru), and combinations thereof.

8. The semiconductor device of claim 1, wherein the at least one first metal line and the at least one second metal line each comprises a contact metal selected from the group consisting of: copper (Cu), ruthenium (Ru), cobalt (Co), tungsten (W), and combinations thereof.

9. The semiconductor device of claim 1, further comprising:
   a liner present under and along sidewalls of the at least one first metal line.

10. The semiconductor device of claim 9, wherein the liner comprises a material selected from the group consisting of: Ti, Ta, TiN, TaN, Ru, and combinations thereof.

11. The semiconductor device of claim 9, wherein the oxygen diffusion blocking layer is present along the sidewalls of the at least one first metal line over the liner only in the overlap area.

12. A semiconductor device, comprising:
   at least one first FET and at least one second FET;
   at least one first metal line in contact with a source or drain of the at least one first FET;
   at least one second metal line in contact with a gate of the at least one first FET, wherein the first metal line crosses the second metal line;
   an oxygen diffusion blocking layer on top of the at least one first metal line in only an overlap area of the at least one first metal line and the at least one second metal line;
   a first vertical interconnect (V0) present over the at least one first metal line and the oxygen diffusion blocking layer in the overlap area of the at least one first metal line and the at least one second metal line;
   at least one third metal line in contact with a source or drain of the at least one second FET;

at least one fourth metal line in contact with a gate of the at least one second FET, wherein the third metal line crosses the fourth metal line; and a second V0 present over the at least one third metal line away from an overlap area of the at least one third metal line and the at least one fourth metal line.

13. The semiconductor device of claim 12, wherein the semiconductor device comprises a static random access memory (SRAM) device, the at least one first FET comprises at least one pull down (PD) transistor, and the at least one second FET comprises at least one pass gate (PG) transistor, and wherein the at least one PD transistor has a lower threshold voltage (Vt) than the at least one PG transistor.

* * * * *